United States Patent
Iki (10) Patent No.: US 8,264,628 B2
(45) Date of Patent: Sep. 11, 2012

(54) CAPACITOR ELEMENT, METHOD FOR MANUFACTURING THE SAME, AND ELECTRO-OPTIC DEVICE

(75) Inventor: Takunori Iki, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 401 days.

(21) Appl. No.: 12/582,565

(22) Filed: Oct. 20, 2009

(65) Prior Publication Data

US 2010/0097536 A1   Apr. 22, 2010

(30) Foreign Application Priority Data

Oct. 21, 2008   (JP) .................... 2008-270614

(51) Int. Cl.
*G02F 1/1343* (2006.01)
(52) U.S. Cl. ........................................................ 349/39
(58) Field of Classification Search ............... 349/39
See application file for complete search history.

(56) References Cited

U.S. PATENT DOCUMENTS 7,473,926 B2 *  1/2009  Lee et al. ................ 257/59

FOREIGN PATENT DOCUMENTS

JP   2007-227752   9/2007
JP   2008-058578   3/2008

* cited by examiner

*Primary Examiner* — James Dudek
(74) *Attorney, Agent, or Firm* — Maschoff Gilmore & Israelsen (57) ABSTRACT

A capacitor element includes a lower conductive portion, an underlying film which covers the lower conductive portion, a lower electrode formed on the underling film, a capacitor insulating film including (i) a dielectric film formed on the lower electrode and (ii) a protective film formed on the dielectric film and having a lower etching rate than that of the dielectric film, and an upper electrode formed on the capacitor insulating film. The upper electrode and the lower conductive portion are electrically connected to each other through a connection portion exposed from the underlying film by partially removing the underlying film and the capacitor insulating film.

3 Claims, 12 Drawing Sheets

CAPACITOR ELEMENT, METHOD FOR MANUFACTURING THE SAME, AND ELECTRO-OPTIC DEVICE

BACKGROUND

1. Technical Field

The present invention relates to the technical field of, for example, a capacitor element, a method for manufacturing the same, and an electro-optic device such as a liquid crystal device, which includes the capacitor element as a holding capacitor.

2. Related Art

In a liquid crystal device which is an example of this sort of electro-optic device, a holding capacitor is provided corresponding to each pixel portion so that an image signal supplied to a pixel electrode is temporarily held. Such a holding capacitor includes a pair of capacitor electrodes and a dielectric film formed between the capacitor electrodes. The pair of capacitor electrodes is electrically connected to wiring provided in a layer different from a layer in which the holding capacitors are formed on a substrate, and constitutes a portion of a circuit portion on the substrate. Japanese Unexamined Patent Application Publication No. 2008-058578 discloses a technique in which for enhancing the efficiency of a process for manufacturing a liquid crystal device, a step of forming contact holes for electrically connecting different layers on a substrate is omitted.

When among the pair of capacitor electrodes, an upper electrode formed above a lower electrode is electrically connected to wiring formed below the holding capacitor, a dielectric film interposed between a pair of electrodes is patterned to a predetermined shape using, for example, an acid etching solution or the like.

However, when a dielectric film is etched with an acid etching solution, the dielectric film is easily etched, and thus it is difficult to pattern the dielectric film into a predetermined shape. For example, when a dielectric film of alumina or the like is formed for increasing the capacitance value of a holding capacitor, the dielectric film of alumina may be formed at a low temperature, and the dielectric film of good quality, which has low leakage current, is formed. However, the dielectric film is easily etched with an acid etching solution. Therefore, even when the dielectric film is formed using a dielectric material which can improve electric characteristics of the dielectric film, there occurs the problem that patterning is difficult by a process for forming holding capacitors.

Such a problem may occur in not only a holding capacitor provided for each pixel portion of a liquid crystal device and a capacitor element in which an upper electrode, which is one of a pair of capacitor electrodes, is electrically connected to a conductive portion provided below the capacitor element.

SUMMARY

An advantage of some aspects of the invention is that the invention provides a capacitor element including a dielectric film which is patterned into a predetermined shape without being excessively etched, a method for manufacturing the same, and an electro-optic device including the capacitor element as a holding capacitor.

According to an embodiment of the present invention, a capacitor element includes a lower conductive portion provided on a substrate, an underlying film which covers the lower conductive portion, a lower electrode formed on the underling film, a capacitor insulating film including (i) a dielectric film formed on the lower electrode and (ii) a protective film formed on the dielectric film and having a lower etching rate than that of the dielectric film, and an upper electrode formed on the capacitor insulating film. The upper electrode and the lower conductive portion are electrically connected to each other through a connection portion exposed from the underlying film by partially removing the underlying film and the capacitor insulating film.

In the capacitor element of the present invention, the lower conductive portion such as a wiring layer is formed on the substrate, and the underlying film such as an insulating film or the like is formed on the lower conductive portion. The lower electrode includes a semiconductor layer of polysilicon or the like, or a metal film, and extends on the underlying film so as to overlap the lower conductive portion.

The capacitor insulating film includes the dielectric film including an alumina layer or the like and formed on the lower electrode and the protective film formed on the dielectric film and composed of a hafnium (Hf)-based material having a lower etching rate than that of the dielectric film. The hafnium (Hf)-based material represents a material containing hafnium, for example, an oxide such as hafnium oxide having a high dielectric constant of about 4 times that of alumina. Such a protective film has a low etching rate for an acid etching solution relative to the dielectric film of alumina or the like. In other words, the material has high resistance to the etching solution and protects the dielectric film so that the dielectric film is not excessively etched when being patterned into a predetermined shape in a process for forming the capacitor element.

The upper electrode is formed on the capacitor insulating film, includes a conductive film of a larger size than the lower electrode, and is formed using, for example, the same conductive material as the lower electrode.

The upper electrode and the lower conductive portion are electrically connected to each other through a connection portion exposed from the underlying film by partially removing the capacitor insulating film. As described above, the capacitor insulating film includes the dielectric film having a high dielectric constant and the protective film having a lower etching rate than that of the dielectric film. Therefore, when the capacitor insulating film is patterned by etching, the dielectric film is patterned into a predetermined shape without being excessively etched. Therefore, the connection portion may be exposed from the underlying film by partially removing the capacitor insulating film so that the dielectric film is patterned into a predetermined shape. The upper electrode and the lower conductive portion are electrically connected to each other, and thus the capacitor element and the lower conductive portion are electrically connected to each other. In addition, in the capacitor element of the present invention, even when the dielectric film is formed using a dielectric material having low resistance to an etching solution, the capacitance value of the capacitor element may be set to a high value.

The capacitor element according to an embodiment of the present invention may further include an interlayer insulating film formed between the capacitor insulating film and the lower electrode outside a region occupied by a layered structure formed by laminating in order the lower electrode, the capacitor insulating film, and the upper electrode.

In this configuration, when the capacitor insulating film is patterned by etching, the lower electrode is protected by the interlayer insulating film so as not to be etched. The layered structure represents an element portion substantially functioning as a capacitor in the capacitor element. Therefore, even if the interlayer insulating film is formed as a portion other than the portion substantially functioning as a capacitor, the electric characteristic of the capacitor element, i.e., the capacitance value, is not decreased.

According to an embodiment of the present invention, a method for manufacturing a capacitor element includes forming a lower electrode on an underling film formed on a lower conductive portion provided on a substrate so as to overlap the lower conductive portion, forming a dielectric film on the lower electrode and then forming a protective film having a lower etching rate than that of the dielectric film on the dielectric film, etching the dielectric film from the protective film so that the dielectric film is patterned to a predetermined planar shape to remove a portion of the dielectric film, which does not overlap the protective film, and forming an upper electrode on the protective film. The upper electrode is formed to overlap a connection portion exposed from the underlying film so that the upper electrode and the lower conductive portion are electrically connected to each other through the connection portion.

In the method for manufacturing a capacitor element, the lower electrode is formed to extend on the underlying film which is formed on the lower conductive portion provided on the substrate so as to overlap the lower conductive portion. The lower electrode is formed by a film forming method such as CVD, PVD, or the like which can be used in a usual semiconductor manufacturing process.

The dielectric film including an alumina film or the like is formed on the lower electrode, and then the protective film composed of hafnium oxide or the like having a lower etching rate than that of the dielectric film is formed on the dielectric film.

The dielectric film is etched from the protective film so that the dielectric film is patterned to a predetermined planar shape to remove a portion of the dielectric film, which does not overlap the protective film. Therefore, the dielectric film is protected by the protective film, and for example, the dielectric film is patterned to a predetermined planar shape without being excessively etched.

Then, the upper electrode of a larger size than the lower electrode is formed on the capacitor insulating film so as to overlap the connection portion exposed from the underlying film. As a result, the upper electrode and the lower conductive portion are electrically connected to each other, and a capacitor element electrically connected to the lower conductive portion is formed on a substrate.

Therefore, like in the above-mentioned capacitor element, the method for manufacturing a capacitor element is capable of forming a capacitor element having a high capacitance value on a substrate and electrically connecting the capacitor element to a lower conductive portion.

According to an embodiment of the present invention, the method for manufacturing a capacitor element may further includes, before forming the dielectric film and the protective film, forming an interlayer insulating film between dielectric film and the lower electrode in a region of a layered structure formed by laminating in order the lower electrode, the dielectric film, and the upper electrode.

In this configuration, when the capacitor insulating film is patterned by etching, the lower electrode is protected by the interlayer insulating film so as not to be etched. In addition, even if the interlayer insulating film is formed as a portion other than a portion substantially functioning as a capacitor, the electric characteristic of the capacitor element, i.e., the capacitance value, is not decreased.

In this case, the interlayer insulating film may be formed by forming the insulating film so that it overlaps the region and then removing a portion of the insulating film, which overlaps the region.

In this case, it may be possible to form the interlayer insulating film while securing a region where a portion substantially functioning as a capacitor in the capacitor element is formed.

According to an embodiment of the present invention, an electro-optic device includes the above-described capacitor element as a storage capacitor electrically connected to a pixel electrode.

Since the electro-optic device includes the above-described capacitor element, it is possible to hold for a predetermined time a pixel electrode potential which is set according to an image signal supplied to each pixel portion during an operation of the electro-optic device and to enhance the display performance.

The operation and other advantages of the present invention are made clear from the embodiment described below.

BRIEF DESCRIPTION OF THE DRAWINGS

The invention will be described with reference to the accompanying drawings, wherein like numbers reference like elements.

FIG. 14 is a plan view in which FIGS. 12 and 13 are superposed.

FIG. 15 is a sectional view in which FIGS. 12 and 13 are superposed, taken along line XV-XV of FIG. 13.

DESCRIPTION OF EXEMPLARY EMBODIMENTS

A capacitor element, a method for manufacturing the same, and an electro-optic device including the capacitor element as a storage capacitor according to embodiments of the present invention are described with reference to the drawings.

<1: Capacitor Element and Method for Manufacturing the Same>

Figure 1:
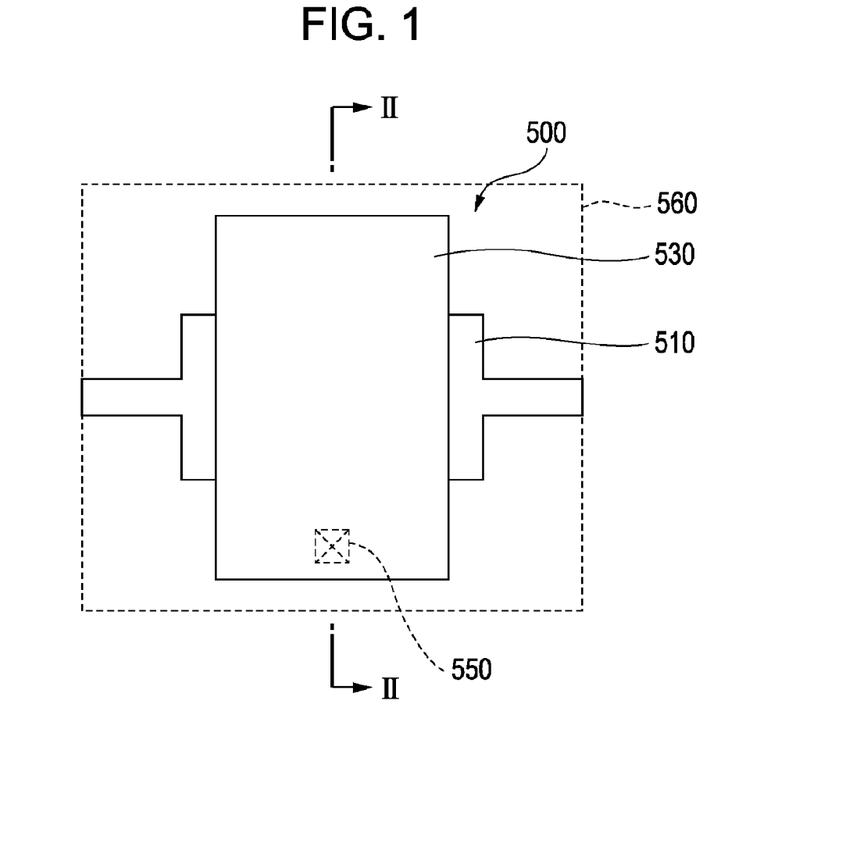
FIG. 1 is a plan view showing a configuration of a capacitor element according to an embodiment of the present invention.
Figure 2:
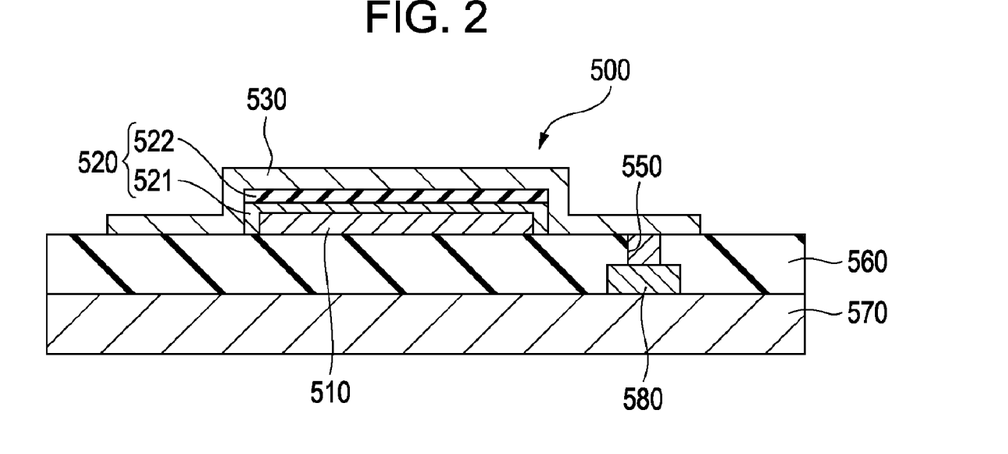
FIG. 2 is a sectional view taken along line II-II of FIG. 1.

A capacitor element and a method for manufacturing the same according to embodiments of the present invention are described with reference to FIGS. 1 to 4B. FIG. 1 is a plan view showing a configuration of a capacitor element according to an embodiment of the present invention. FIG. 2 is a sectional view taken along line II-II of FIG. 1. FIGS. 3A, 3B, 4A, and 4B are sectional views showing in order principal steps of a method for manufacturing a capacitor element according to an embodiment of the present invention.

In FIGS. 1 and 2, a capacitor element 500 includes a lower electrode 510, a capacitor insulating film 520, and an upper electrode 530.

The lower electrode 510 is formed above a lower conductive portion 580, such as wiring, provided on a substrate 570 so as to overlap the lower conductive portion 580 and extend on an underlying film 560 composed of an insulating material. The underlying film 560 includes, for example, a semiconductor layer of polysilicon or the like, or a metal film.

The capacitor insulating film 520 has a layered structure including a dielectric film 521 composed of an alumina layer and formed on the lower electrode 510, and a protective film 522 formed on the dielectric film 521 and composed of a hafnium (Hf)-based material having a lower etching rate than that of the dielectric film 521. In other words, the protective film 522 is composed of a material having a lower etching rate for an acid etching solution than that of the dielectric film 521 of alumina or the like, i.e., high resistance to the etching solution. Therefore, the protective film 522 protects the dielectric film so that the dielectric film 521 is not excessively etched when being patterned into a predetermined shape in a process for forming the capacitor element 500. In addition, the dielectric constant of the protective film 522 composed of the hafnium-based material is about 4 times that of the dielectric film 521 composed of alumina. Therefore, the capacitance value of the capacitor element 500 is set to a high value as compared with the case in which only a dielectric film of alumina or the like is provided.

The upper electrode 530 is formed on the capacitor insulating film 520, includes a conductive film of a larger size than the lower electrode 510, and is formed using, for example, the same conductive material as the lower electrode 510.

The upper electrode 530 and the lower conductive portion 580 are electrically connected to each other through a contact hole 550, which is an example of a connection portion of the present invention and exposed from the underlying film 560 by partially removing the dielectric film 521 of the capacitor insulating film 520.

As described above, the capacitor insulating film 520 includes the dielectric film 521 having a high dielectric constant and the protective film 522 having a lower etching rate than that of the dielectric film 521. Therefore, when the capacitor insulating film 520 is patterned by etching, the dielectric film 521 is patterned into a predetermined shape without being excessively etched. Therefore, the contact hole 550 may be exposed from the underlying film 560 by partially removing the dielectric film 521 so that the dielectric film 521 is patterned into a predetermined shape. The upper electrode 530 and the lower conductive portion 580 are electrically connected to each other, and thus the capacitor element 500 and the lower conductive portion 580 are electrically connected to each other. In addition, in the capacitor element 500, even when the dielectric film 521 is formed using a dielectric material having low resistance to an etching solution, the capacitance value of the capacitor element 500 may be set to a high value.

Next, the principal steps of the method for manufacturing the capacitor element 500 are successively described with reference to FIGS. 3A to 4B. Hereinafter, portions common to the above-described capacitor element 500 are denoted by common reference numerals, and detailed description is omitted.

Figure 3A:
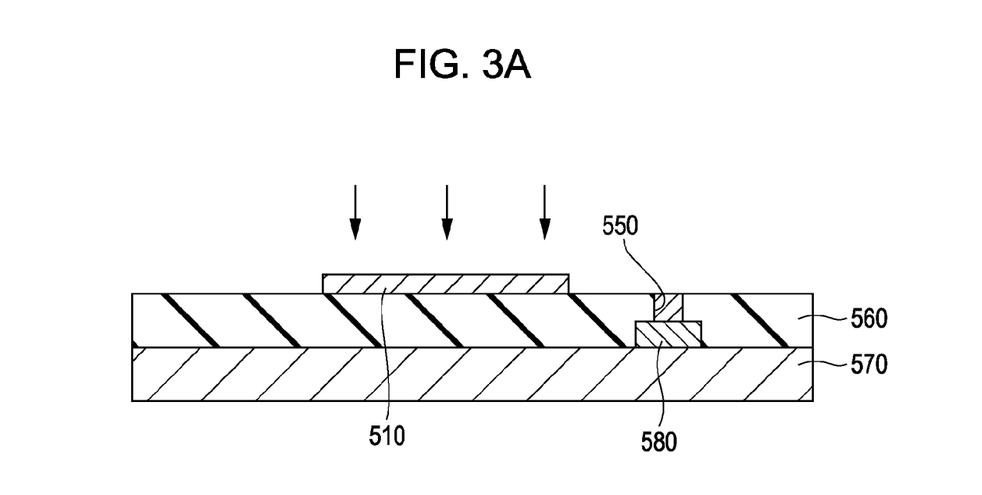
FIG. 3A is a sectional view showing a principal step of a method for manufacturing a capacitor element according to an embodiment of the present invention.

As shown in FIG. 3A, the lower electrode 510 is formed to extend on the underlying film 560 which is formed on the lower conductive portion 580 provided on the substrate 570 so as to overlap the lower conductive portion 580. The lower conductive portion 580 is previously formed on the substrate 570 before the underlying film 560 is formed. The lower electrode 510 is formed by a film forming method such as CVD, PVD, or the like which can be used in a usual semiconductor manufacturing process.

Figure 3B:
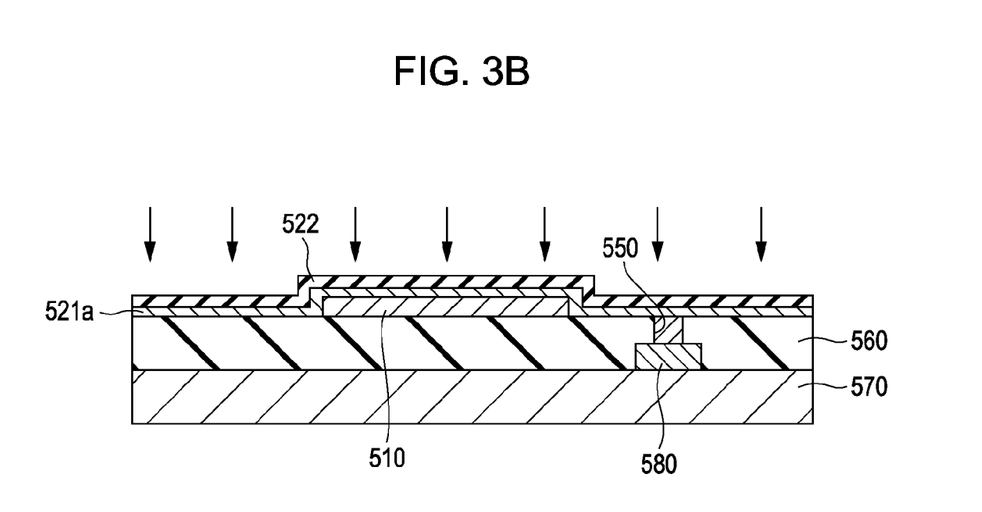
FIG. 3B is a sectional view showing a principal step of a method for manufacturing a capacitor element according to an embodiment of the present invention.

Next, as shown in FIG. 3B, a dielectric film 521a is formed on the lower electrode 510, and then the protective film 522 having a lower etching rate than that of the dielectric film 521a is formed on the dielectric film 521a. In this case, a portion of the dielectric film 521a, which overlaps the lower electrode 510, constitutes the dielectric film 521 as a portion of the capacitor insulating film 520. The dielectric film 521 is composed of, for example, a dielectric material such as an alumina film or the like. The protective film 522 is composed of an oxide, such as hafnium oxide or the like, which has a lower etching rate than that of the dielectric film 521a.

Figure 4A:
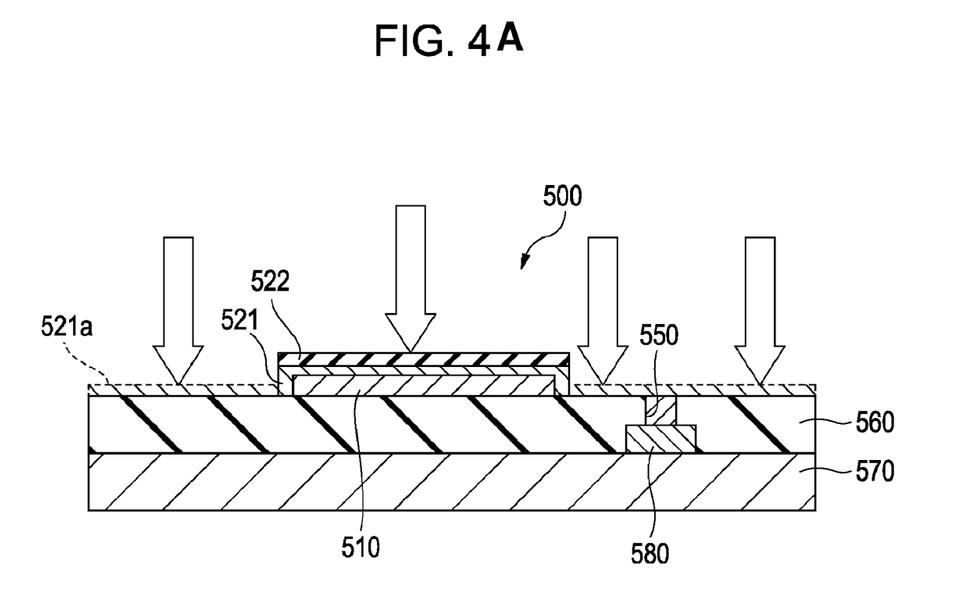
FIG. 4A is a sectional view showing a principal step of a method for manufacturing a capacitor element according to an embodiment of the present invention.

Next, as shown in FIG. 4A, the dielectric film 521a is etched from the protective film 522 using, for example, an acid etching solution such as hydrochloric acid or the like, so that the dielectric film 521a is patterned to a predetermined planar shape to remove a portion of the dielectric film 521a, which does not overlap the protective film 522. In this case, a portion of the protective film 522, which overlaps the contact hole 550, may be removed before etching of the dielectric film 521a. Therefore, the dielectric film 521 which finally constitutes a portion of the capacitor insulating film 520 is protected by the protective film 522, and the dielectric film 521a is formed into the dielectric film 521 having a predetermined planar shape without being excessively etched.

Figure 4B:
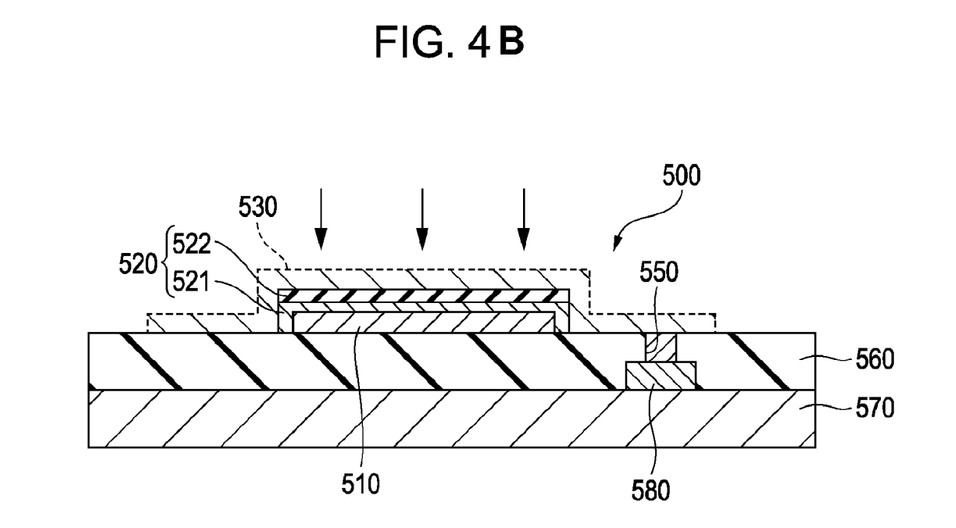
FIG. 4B is a sectional view showing a principal step of a method for manufacturing a capacitor element according to an embodiment of the present invention.

Then, as shown in FIG. 4B, the upper electrode 530 of a larger size than the lower electrode 510 is formed on the capacitor insulating film 520 so as to overlap the contact hole 550 exposed from the underlying film 560. As a result, the upper electrode 530 and the lower conductive portion 580 are electrically connected to each other through the contact hole 550, and the capacitor element 500 electrically connected to the lower conductive portion 580 is formed on the substrate 570.

Therefore, the method for manufacturing a capacitor element of this embodiment is capable of forming a capacitor element 500 having a high capacitance value on a substrate 570 and electrically connecting the capacitor element 500 to a lower conductive portion 580.

Figure 5:
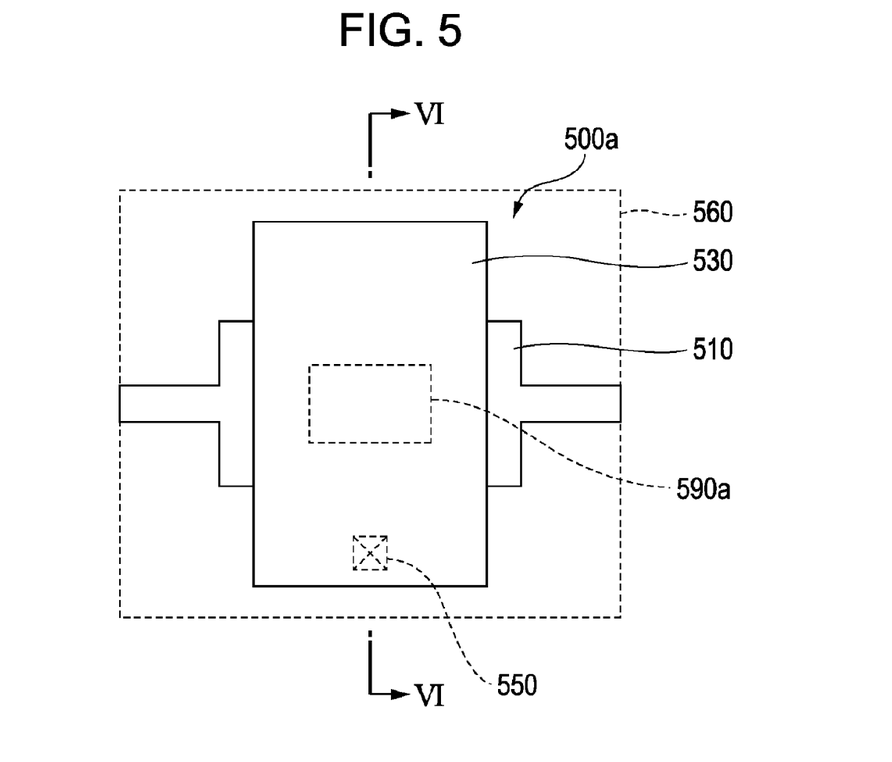
FIG. 5 is a plan view showing a configuration of a capacitor element according to another embodiment of the present invention.
Figure 6:
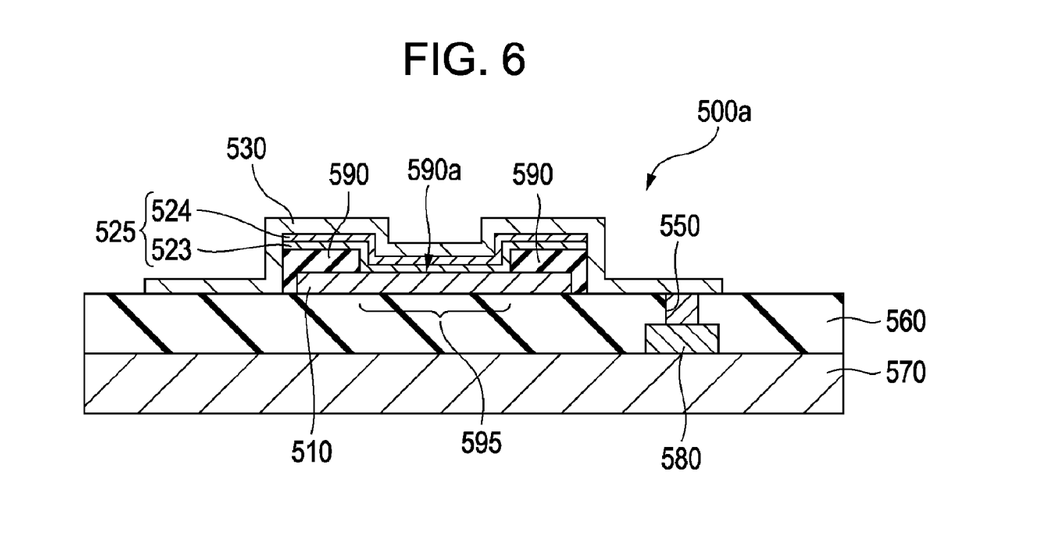
FIG. 6 is a sectional view taken along line VI-VI of FIG. 5.

A capacitor element and a method for manufacturing the same according to other embodiments of the present invention are described with reference to FIGS. 5 to 8E. FIG. 5 is a plan view showing a configuration of a capacitor element according to an embodiment of the present invention. FIG. 6 is a sectional view taken along line VI-VI of FIG. 5. FIGS. 7A, 7B, 7C, 8A, and 8B are sectional views showing in order principal steps of a method for manufacturing a capacitor element according to an embodiment of the present invention.

As shown in FIGS. 5 and 6, a capacitor element 500a according to this embodiment is different from the above-described capacitor element 500 in that an interlayer insulating film 590 is provided.

The interlayer insulating film 590 is formed between a capacitor insulating film 525 and a lower electrode 510 outside a region occupied by a layered structure 595 which is formed by stacking in order the lower electrode 510, the capacitor insulating film 525, and an upper electrode 530. The capacitor insulating film 525 is formed by laminating a dielectric film 523 and a protective film 524 composed of the same materials as the above-described dielectric film 521 and the protective film 522, respectively. In the capacitor element 500a, a portion substantially functioning as a capacitor includes portions of the lower electrode 510, the capacitor insulating film 525, and the upper electrode 520, which overlap an opening 590a formed in the interlayer insulating film 590. The thicknesses of the interlayer insulating film 590, the dielectric film 523, and the protective film 524 are, for example, about 200 nm, 20 nm, and 5 nm, respectively. In the capacitor element 500a, when the dielectric film 523 of the capacitor insulating film 525 is patterned by etching, the lower electrode 510 can be protected by the interlayer insulating film 590 so as not to be etched. Therefore, even when the interlayer insulating film 590 is formed as a portion other than the portion substantially functioning a capacitor, the electric characteristics of the capacitor element 500, i.e., the capacitance value, is not decreased. In addition, the interlayer insulating film 590 suppresses deterioration of the lower electrode 510 due to etching.

Next, the method for manufacturing the capacitor element according to this embodiment is described with reference to FIGS. 7A to 8B.

Figure 7A:
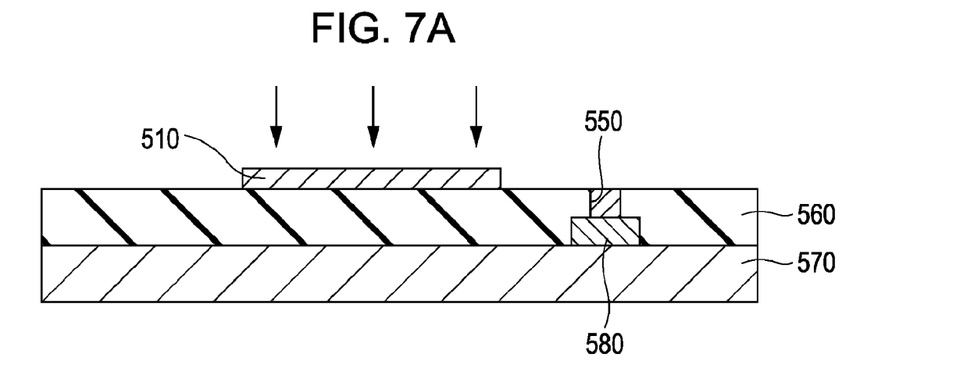
FIG. 7A is a sectional view showing a principal step of a method for manufacturing a capacitor element according to another embodiment of the present invention.

As shown in FIG. 7A, like in the method for manufacturing the capacitor element 500, the lower electrode 510 is formed to extend on the underlying film 560 which is formed on the lower conductive portion 580 provided on the substrate 570 so as to overlap the lower conductive portion 580. The lower electrode 510 is formed by a film forming method such as CVD, PVD, or the like which can be used in a usual semiconductor manufacturing process.

Figure 7B:
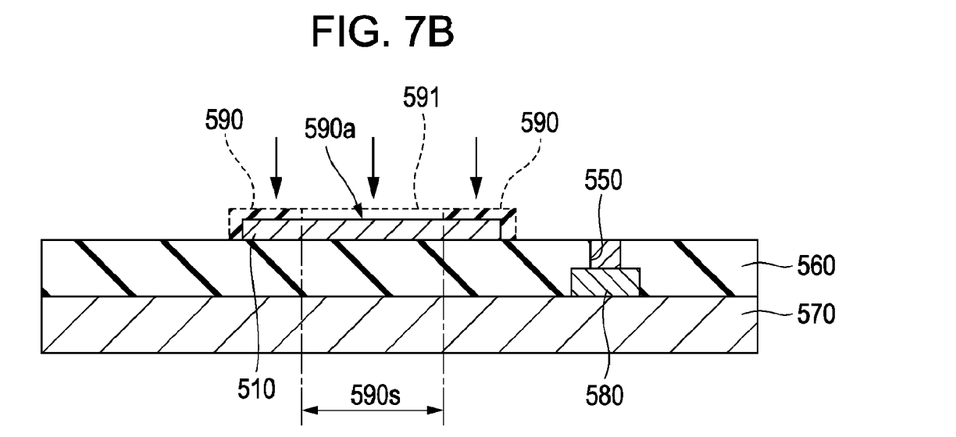
FIG. 7B is a sectional view showing a principal step of a method for manufacturing a capacitor element according to an embodiment of the present invention.

Next, as shown in FIG. 7B, the interlayer insulating film 590 is formed on the lower electrode 510 outside a region 590s occupied by the layered structure 595 which is formed by stacking in order the lower electrode 510, the capacitor insulating film 525, and the upper electrode 530. More specifically, an insulating film is formed to overlap the region 590s, and a portion of the insulating film, which overlaps the region 590s, is removed, leaving a insulating film portion as the interlayer insulating film 590.

Therefore, when the dielectric film 523 which is a portion of the capacitor insulating film 525 is patterned by subsequent etching, the lower electrode 510 is protected by the interlayer insulating film 590 so as not to be etched. In addition, even if the interlayer insulating film 590 is formed as a portion other than a portion substantially functioning as a capacitor, the electric characteristic of the capacitor element 500a, i.e., the capacitance value, is not decreased. Therefore, it may be possible to form the interlayer insulating film 590 while securing a region where a portion substantially functioning as a capacitor in the capacitor element 500a is formed.

Figure 7C:
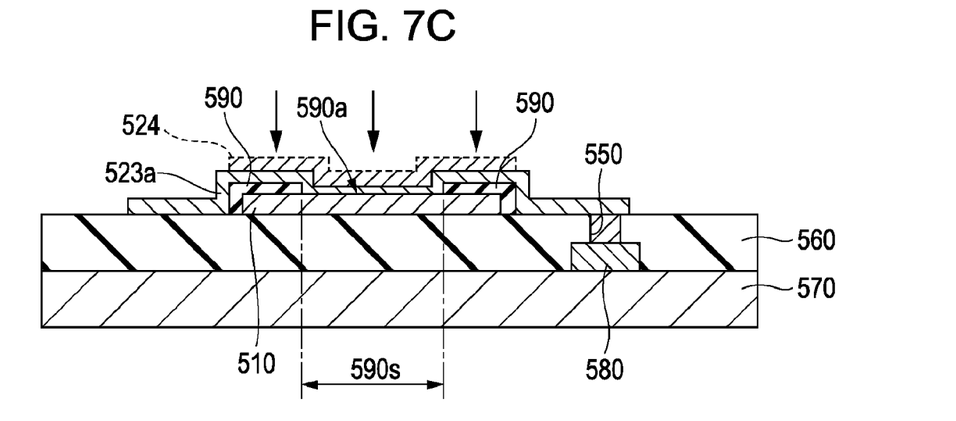
FIG. 7C is a sectional view showing a principal step of a method for manufacturing a capacitor element according to an embodiment of the present invention.

Next, as shown in FIG. 7C, a dielectric film 523a is formed on the lower electrode 510, and then the protective film 524 having a lower etching rate than that of the dielectric film 523a is formed on the dielectric film 523a.

Figure 8A:
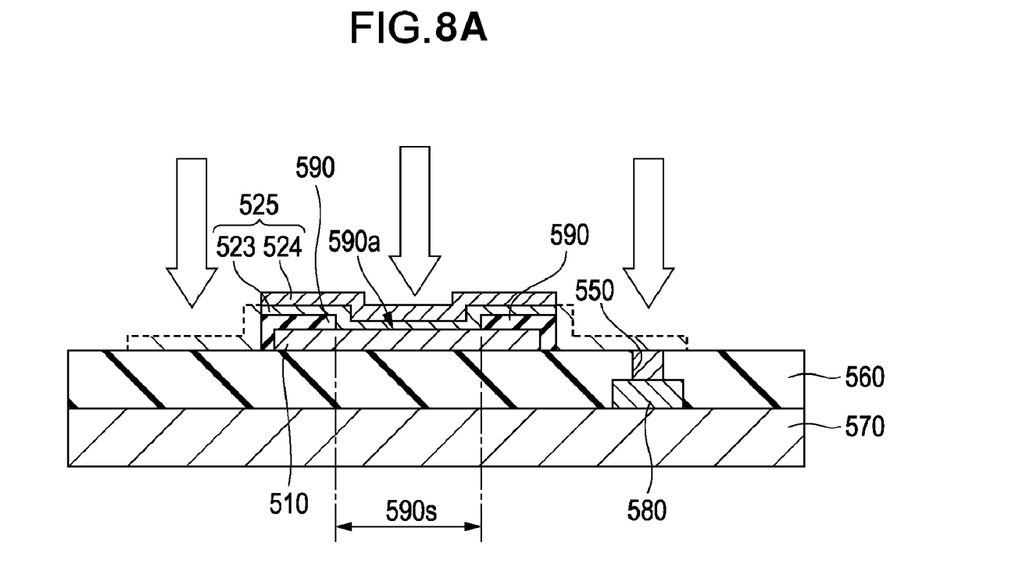
FIG. 8A is a sectional view showing a principal step of a method for manufacturing a capacitor element according to an embodiment of the present invention.

Next, as shown in FIG. 8A, the dielectric film 523a is etched from the protective film 524 so that the dielectric film 523a is patterned to a predetermined planar shape to remove a portion of the dielectric film 523a, which does not overlap the protective film 524.

Figure 8B:
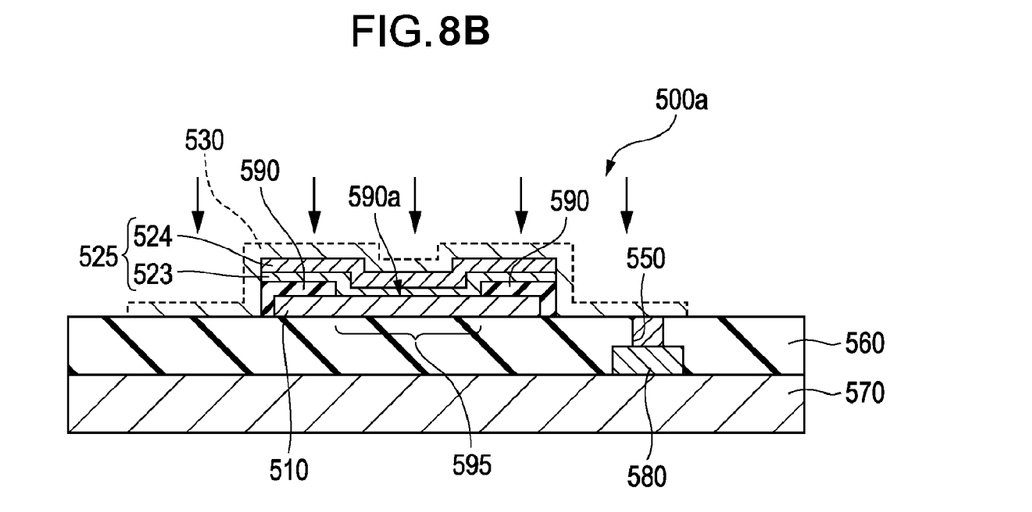
FIG. 8B is a sectional view showing a principal step of a method for manufacturing a capacitor element according to an embodiment of the present invention.

Then, as shown in FIG. 8B, the upper electrode 530 of a larger size than the lower electrode 510 is formed on the capacitor insulating film 525 so as to overlap the contact hole 550 exposed from the underlying film 560. As a result, the upper electrode 530 and the lower conductive portion 580 are electrically connected to each other through the contact hole 550.

Therefore, like in the above-mentioned capacitor element 500a, the method for manufacturing a capacitor element according to the embodiment is capable of forming a capacitor element 500a having a high capacitance value on a substrate 570 and electrically connecting the capacitor element 500a to a lower conductive portion 580.

<2: Electro-Optic Device>

Next, the configuration of a liquid crystal device which is an example of an electro-optic device including as a storage capacitor a capacitor element having the same configuration as the above-described capacitor element 500 is described with reference to FIGS. 9 to 15.

<2-1: Overall Configuration of Electro-Optic Device>

Figure 9:
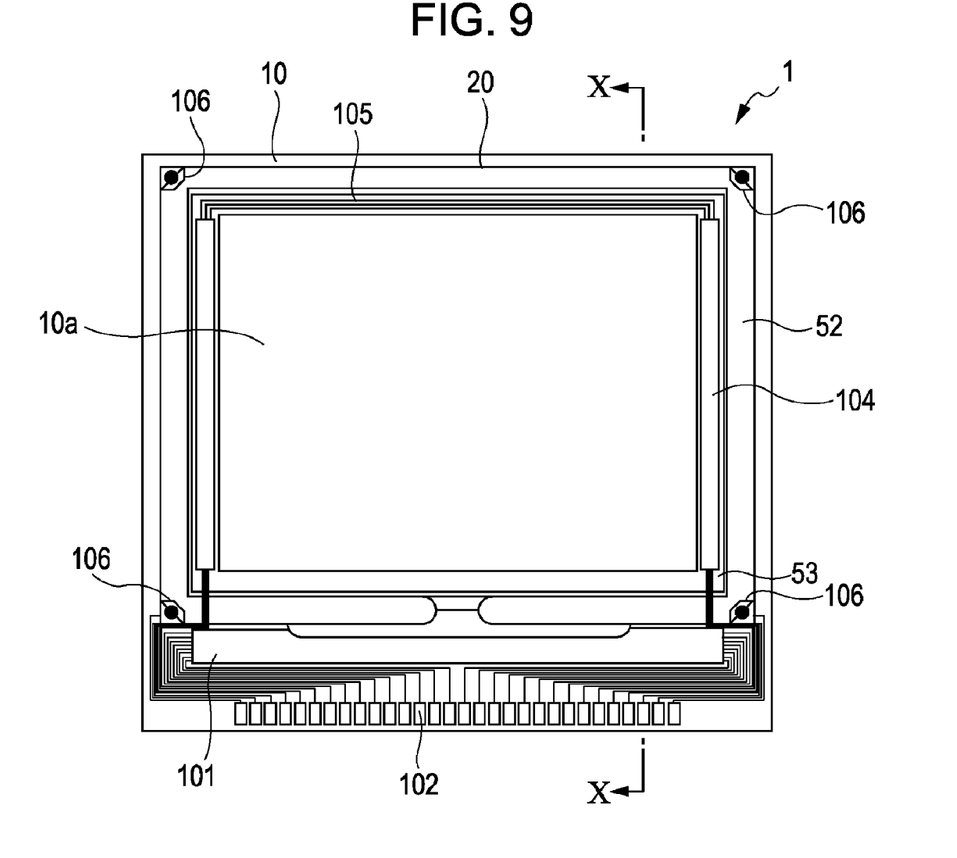
FIG. 9 is a plan view showing an electro-optic device according to another embodiment of the present invention as viewed from the counter substrate side.
Figure 10:
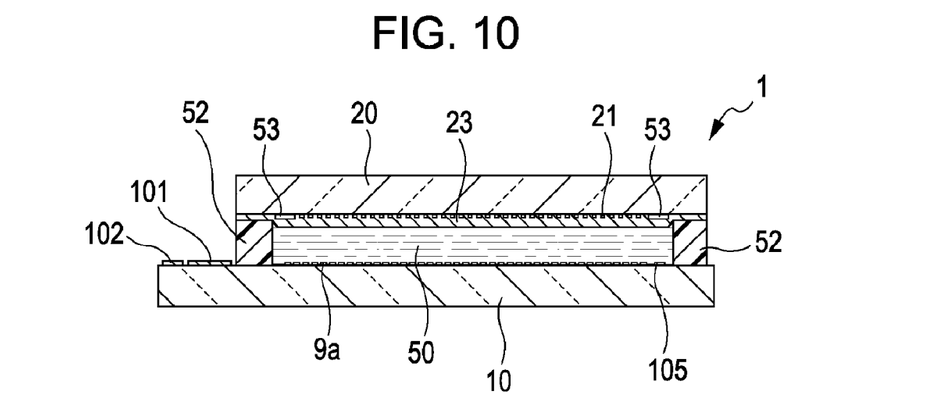
FIG. 10 is a sectional view taken along line X-X of FIG. 9.
Figure 11:
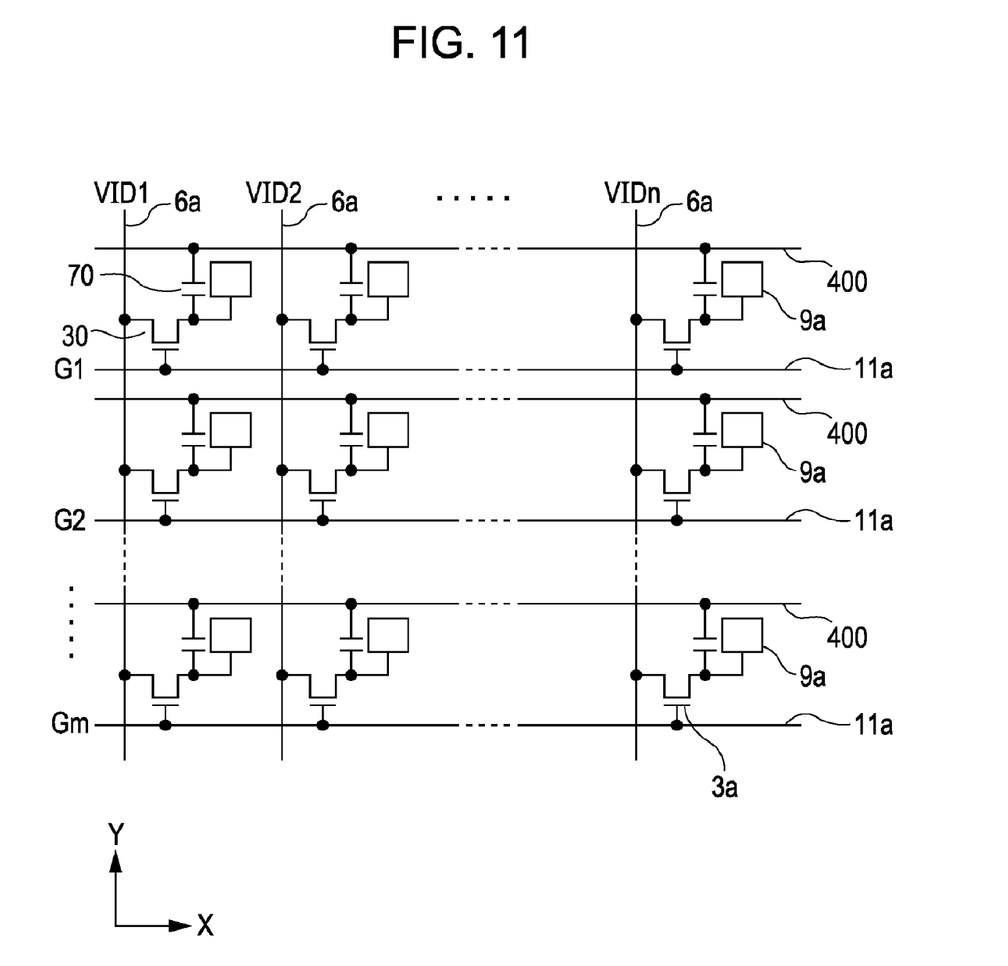
FIG. 11 is an equivalent circuit diagram showing various elements, wiring, etc. in a plurality of pixels formed in a matrix and constituting an image display region of an electro-optic device according to an embodiment of the present invention.

First, the overall configuration of a liquid crystal device according to an embodiment of the present invention is described with reference to FIGS. 9 to 11. FIG. 9 is a plan view of a liquid crystal device as viewed from the counter substrate side. FIG. 10 is a sectional view taken along line X-X of FIG. 9.

In FIGS. 9 and 10, a liquid crystal device 1 includes a TFT array substrate 10 and a counter substrate 20 which are disposed to face each other. A liquid crystal layer 50 is sealed between the TFT array substrate 10 and the counter substrate 20. The TFT array substrate 10 and the counter substrate 20 are bonded together with a sealing material 52 provided in a seal region disposed around an image display region 10a. The sealing material 52 is composed of, for example, an ultraviolet curable resin, a thermosetting resin, or the like, for bonding both substrates together. In the manufacturing process, the sealing material 52 is applied on the TFT array substrate 10 and then cured by ultraviolet irradiation, heating, or the like. The sealing material 52 contains a gap material, such as glass fibers or glass beads, dispersed therein for controlling the gap (substrate gap) between the TFT array substrate 10 and the counter substrate 20 to a predetermined value. In addition, on the counter substrate 20 side, a frame light-shielding film 53 which defines a frame region of the image display region 10a is provided in parallel to the inner side of the seal region in which the sealing material 52 is disposed. However, part or the whole of the frame light-shielding film 53 may be provided as a built-in light-shielding film on the TFT array substrate 10 side.

In a peripheral region around the image display region 10a on the TFT array substrate 10, a data line drive circuit 101, external circuit connection terminals 102, and a sample hold circuit (not shown) are provided along one of the sides of the TFT array substrate 10. Scanning line drive circuits 104 are provided along the two sides adjacent to the one side so as to be covered with the frame light-shielding film 53. Further, in order to connect the two scanning line drive circuits 104 provided on both sides of the image display region 10a, a plurality of wirings is provided along the remaining one side of the TFT array substrate 10 so as to be covered with the frame light-shielding film 53. Further, vertical conduction terminals 106 are provided between the TFT array substrate 10 and the counter substrate 20 in order to secure electric conduction between both substrates.

In FIG. 10, pixel electrodes 9a are formed on pixel switching TFTs, various wirings, and the like on the TFT array substrate 10, and an alignment film is formed on the pixel electrodes 9a. On the other hand, a counter electrode 21 is formed in the image display region 10a on the counter substrate 20 so as to face a plurality of pixel electrodes 9a through a liquid crystal layer 50. That is, when a voltage is applied to each electrodes, liquid crystal holding capacitance is formed between the pixel electrodes 9a and the counter electrode 21. In addition, lattice- or stripe-shaped light-shielding films 23 are formed on the counter electrode 21, and are covered with an alignment film. The liquid crystal layer 50 includes one type of nematic liquid crystal or a mixture of several types of nematic liquid crystals and assumes a predetermined orientation state between a pair of the alignment films.

<2-2: Basic Configuration of Pixel Portion>

Next, a circuit configuration in the image display region 10a of the liquid crystal device 1 is described with reference to FIG. 11. FIG. 11 is an equivalent circuit diagram showing various elements, wiring, etc. in a plurality of pixels formed in a matrix and constituting the image display region of the liquid crystal device 1.

Each of the plurality of pixels formed in a matrix and constituting the image display region 10a of the liquid crystal device 1 includes the pixel electrode 9a and TFT 30 for switching control of the pixel electrode 9a, a corresponding data line 6a to which image signals are supplied being electrically connected to a source of the TFT 30. Image signals VID1, VID2, ..., VIDn written on the data lines 6a may be supplied in a line-sequential manner in that order or supplied to each group of a plurality of adjacent data lines 6a.

A corresponding scanning line 11a is electrically connected to a gate of the TFT 30, and scanning signals G1, G2, ..., Gm are applied as pulses to the scanning lines 11a with predetermined timing in a line sequential manner in that order. The pixel electrode 9a is electrically connected to a drain of the TFT 30, and a switch of the TFT 30 serving as a switching element is closed for a predetermined period so that the image signals VID1, VID 2, ..., VIDn supplied from the data lines 6a are written with predetermined timing.

The image signals VID1, VID 2, ..., VIDn at a predetermined level written in the liquid crystal through the pixel electrodes 9a are held for a predetermined time between the pixel electrodes 9a and the counter electrode formed on the counter substrate. The liquid crystal changes in molecular assembly orientation and order according to the voltage level applied and modulates light, thereby permitting gradient display. In a normally white mode, transmittance for incident light decreases depending on the applied voltage by pixel units, while in a normally black mode, transmittance for incident light increases depending on the applied voltage by pixel units. As a whole, light with a contrast according to an image signal is emitted from a liquid crystal device.

In order to prevent leakage of an image signal stored, a holding capacitor 70 is added in parallel to a liquid crystal capacitance formed between the pixel electrode 9a and the counter electrode. The holding capacitor 70 has the same configuration as that of the capacitor element 500. One of the electrodes of the holding capacitor 70 is connected to the drain of the TFT 30 in parallel to the pixel electrode 9a, and the other electrode is electrically connected to corresponding capacitor wiring 400 at a fixed potential so as to be at a constant potential.

<2-3: Specific Configuration of Pixel Portion>

Figure 12:
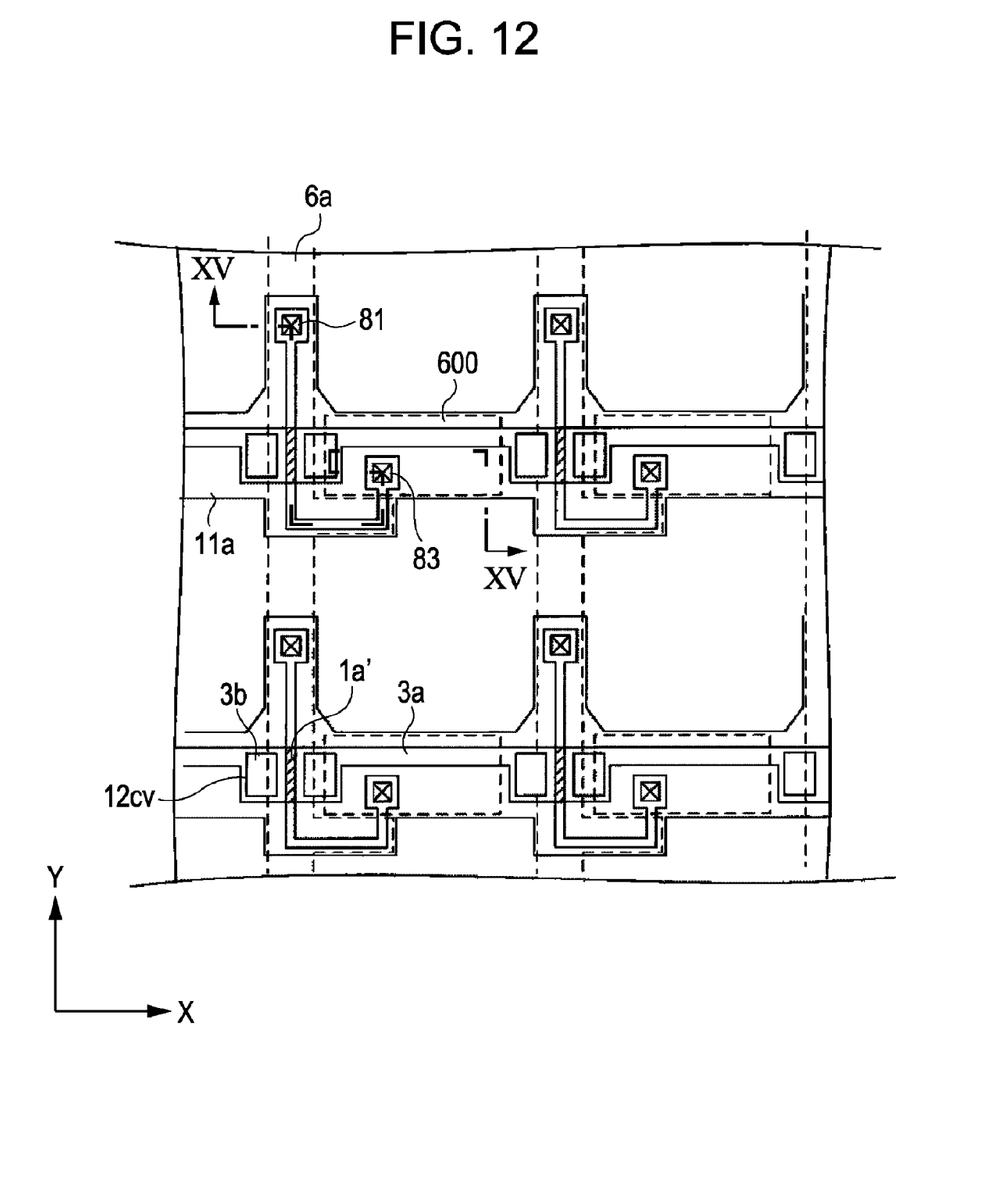
FIG. 12 is a plan view showing a pixel portion of an electro-optic device according to another embodiment of the present invention.
Figure 13:
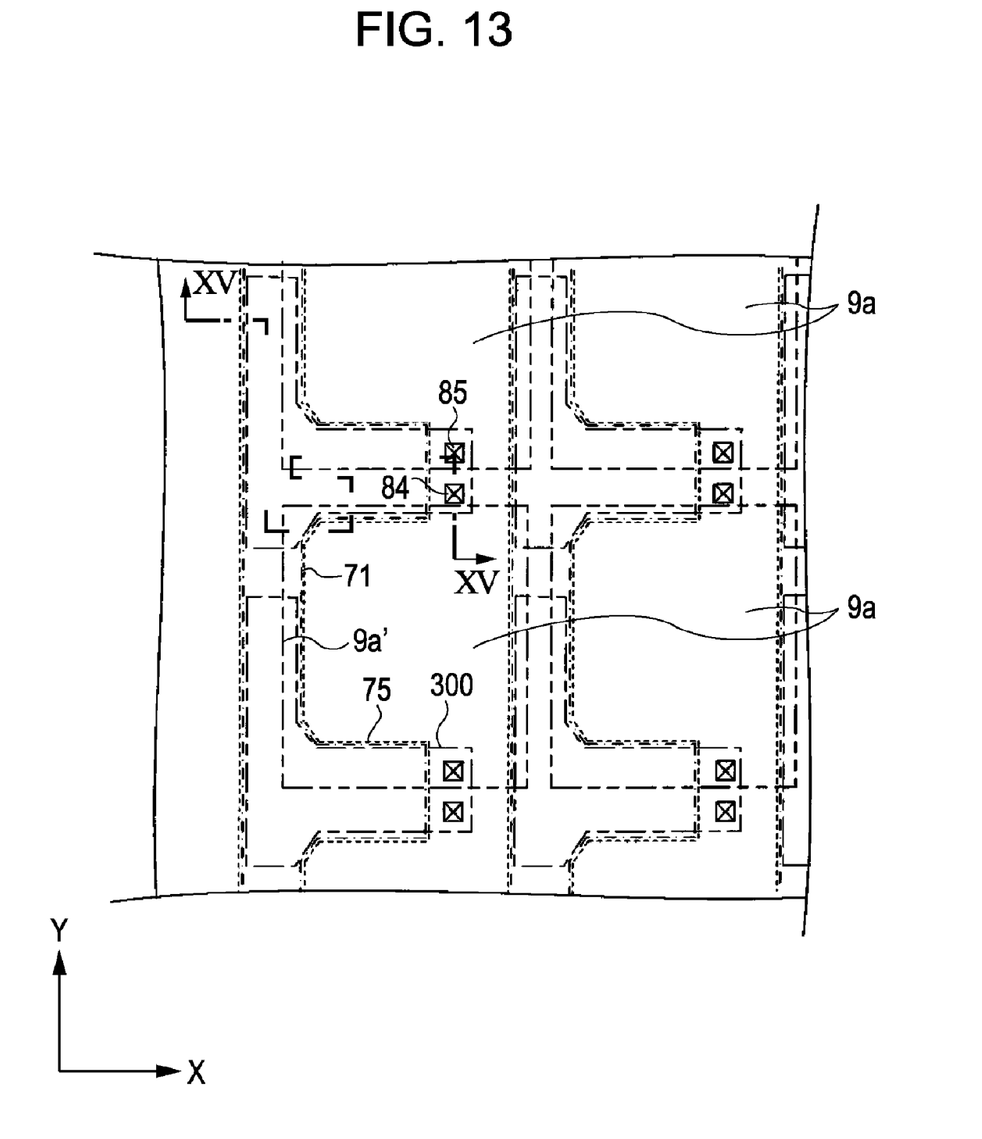
FIG. 13 is a plan view showing a pixel portion of an electro-optic device according to another embodiment of the present invention.
Figure 14:
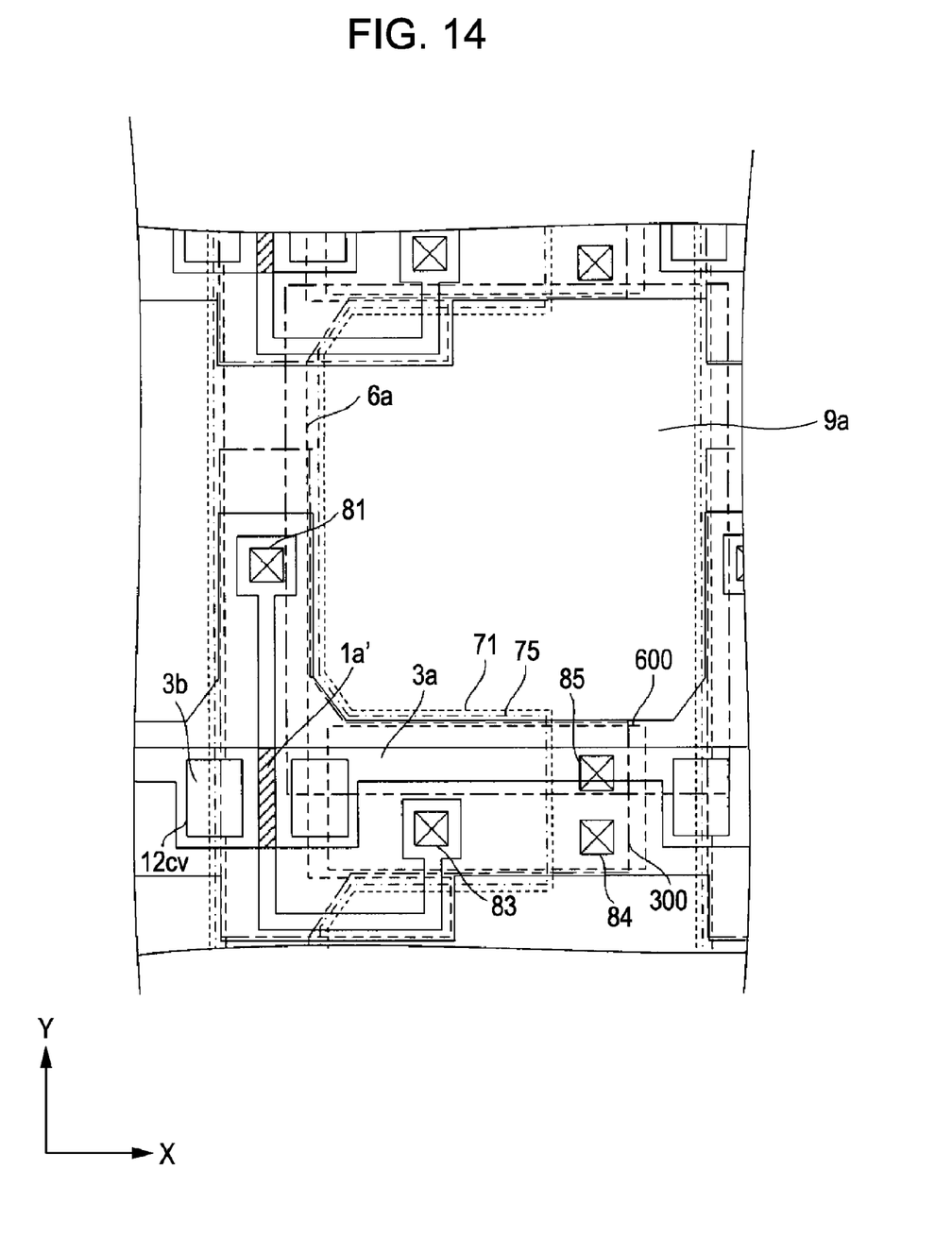
Figure 15:
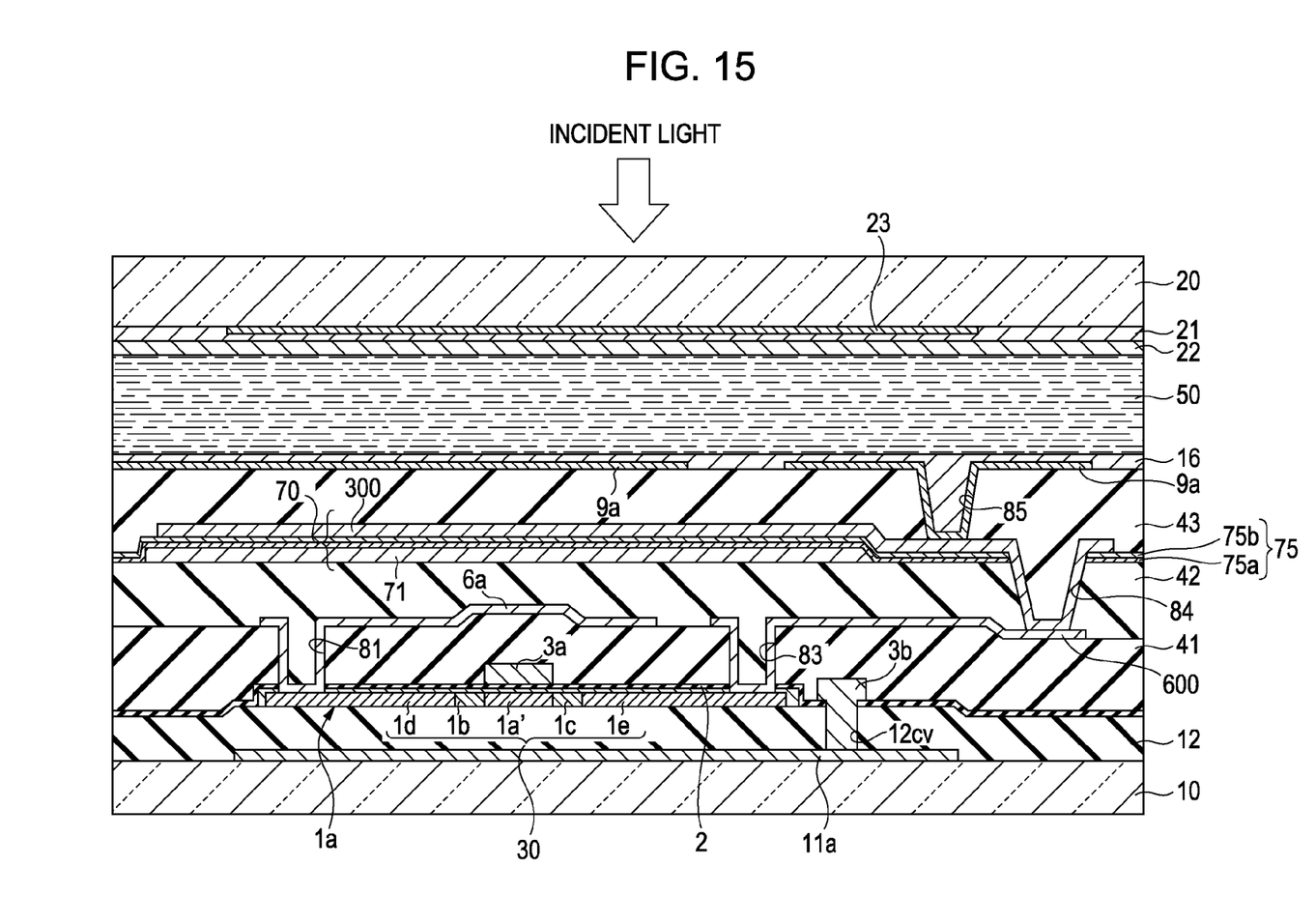

A specific configuration of the pixel portion of the liquid crystal device 1 is described with reference to FIGS. 12 to 15. FIGS. 12 to 14 are plan views each showing a partial configuration of the pixel portion on the TFT array substrate 10. FIGS. 12 and 13 correspond to a lower layer portion (FIG. 12) and an upper layer portion (FIG. 13) of a layered structure described below. FIG. 14 is an enlarged plan view of a layered structure (apart from the layered structure in the capacitor element), in which FIGS. 12 and 13 are superposed. FIG. 15 is a sectional view taken along line XV-XV in a plan view in which FIGS. 12 and 13 are superposed. In FIG. 15, the contraction scales of the layers and members are different for making the size of each of the layers and members recognizable in the drawing.

In FIGS. 12 to 15, the circuit elements of the pixel portion include a first layer including the scanning lines 11a, a second layer including the TFTs 30, etc, a third layer including the data lines 6a, etc, a fourth layer including the holding capacitors 70, etc, and a fifth layer including the pixel electrodes 9a, etc. in that order from below. In addition, an underlying insulating film 12 is provided between the first and second layers, and a first interlayer insulating film 41, a second interlayer insulating film 42, and a third interlayer insulating film 43 are provided between the second and third layers, between the third and fourth layers, and between the fourth and fifth layers, respectively, thereby preventing short circuiting between the circuits elements. The first to third layers are shown as the lower layer portion in FIG. 12, and the fourth and fifth layers are shown as the upper layer portion in FIG. 13.

(Configuration of First Layer—Scanning Lines, Etc—)

The first layer includes the scanning lines 11a. The scanning lines 11a are patterned to a shape including main lines extending along the X direction in FIG. 12 and projecting portions extending along the Y direction in FIG. 12, in which the data lines 6a extend. The scanning lines 11a are composed of, for example, conductive polysilicon, an elemental metal, an alloy, a metal silicide, or polysilicide containing at least one of refractory metals such as titanium (Ti), chromium (Cr), tungsten (W), tantalum (Ta), molybdenum (Mo), and the like, or a laminate thereof. In this embodiment, in particular, the scanning lines 11a are conductive films arranged below the TFTs 30 so as to include regions facing channel regions 1a'. Therefore, the scanning lines 11a can shield, on the lower layer side, the channel regions 1a' from return light such as light reflected by the back of the TFT array substrate 10, light emitted from another liquid crystal device and passing through a synthesis optical system such as a prism when the liquid crystal device is used as a light valve to form a double-plate projector, and the like.

(Configuration of Second Layer—Tft, Etc—)

The second layer includes the TFTs 30. Each TFT 30 has, for example, a LDD (Lightly Doped Drain) structure and is provided with a gate electrode 3a, a semiconductor layer 1a, and an insulating film 2 including a gate insulating film which insulates the gate electrode 3a from the semiconductor layer 1a. The gate electrode 3a is composed of, for example, conductive polysilicon. The semiconductor layer 1a is composed of, for example, polysilicon, and includes a channel region 1a', a low-concentration source region 1b, a low-concentration drain region 1c, a high-concentration source region 1d, and a high-concentration drain region 1e. The TFT 30 preferably has a LDD structure, but may have an offset structure in which impurities are not implanted into the low-concentration source region 1b and the low-concentration drain region 1c or a self-aligned TFT in which a high concentration of impurities is implanted using the gate electrode 3a as a mask to form a high-concentration source region and a high-concentration drain region.

The gate electrode 3a of the TFT 30 is electrically connected, in a portion 3b, to the corresponding scanning line 11a through a contact hole 12cv formed in the underlying insulating film 12. The underlying insulating film 12 is composed of, for example, a silicon oxide film or the like, and has an interlayer insulating function between the first and second layers. In addition, the underlying insulating film 12 is formed over the entire surface of the TFT array substrate 10 and thus has the function to prevent changes of the element characteristics of the TFT 30 due to roughening or staining by polishing of the substrate surface. Although, in this embodiment, the TFT 30 is a top-gate type, it may be a bottom-gate type.

(Configuration of Third Layer—Data Lines, Etc—)

The third layer includes the data lines 6a and relay layers 600.

The data lines 6a each include a single-layer or multilayer metal film containing aluminum or the like. The data lines 6a may be formed as three-layer films each including aluminum, titanium nitride, and silicon nitride which are deposited in that order from below. The data lines 6a are formed to partially cover the channel regions 1a' of the TFTs 30. Therefore, the channel regions 1a' of the TFTs 30 are shielded from incident light on the upper layer side by the data lines 6a which can be disposed near the channel regions 1a'. The data lines 6a are electrically connected to the high-concentration source regions 1d of the TFTs 30 through contact holes 81 passing through the first interlayer insulating film 41.

The relay layers 600 are formed as the same films as the data lines 6a. As shown in FIG. 12, the relay layers 600 and the data lines 6a are formed to be separated. The relay layers 600 are electrically connected to the high-concentration drain regions 1e of the TFTs 30 through contact holes 83 passing through the first interlayer insulating film 41.

The first interlayer insulating film 41 is composed of, for example, NSG (non-silicate glass). Silicate glass such as PSG (phosphosilicate glass), BSG (boron silicate glass), BPSG (borophosphosilicate glass), and the like, silicon nitride, silicon oxide, and the like may be used for the first interlayer insulating film 41.

(Configuration of Fourth Layer—Storage Capacitors, Etc—)

The fourth layer includes the storage capacitors 70. Each of the storage capacitors 70 includes a capacitor electrode 300 as an upper electrode and a lower electrode 71 which is opposed to each other with a capacitor insulating film 75 provided therebetween. The capacitor insulating film 75 has a structure in which a dielectric film 75a having a high dielectric constant and a protective film 75b having a lower etching rate than that of the dielectric film 75a are laminated. A contact hole 84 is formed after an opening is formed by etching a portion of the dielectric film 75a, which does not overlap the protective film 75b. An extension of the capacitor electrode 300 is electrically connected to the relay layer 600 through the contact hole 84 passing through the second interlayer insulating film 42.

The capacitor electrode 300 and the lower electrode 71 are metal films each having a single-layer or multilayer structure containing at least one of the metals such as Al, Ti, Cr, W, Ta, Mo, and the like. The capacitor electrode 300 and the lower electrode 71 may have a layered structure including an alloy, metal silicide, polysilicide, and nitride. The storage capacitors 70 disposed on the data lines 6a through the interlayer insulating film 42 and adjacent to the TFTs 30 securely shield the channel regions 1a' of the TFTs 30 from incident light on the upper layer side.

In addition, as shown in FIG. 6, the capacitor electrode 300 is formed in a region smaller than the lower electrode 71 in a plan view of the TFT array substrate 10. That is, the capacitor electrode 300 is not formed on the side facing the lower electrode 71 through the dielectric film 75 near the edge of the lower electrode 71. Therefore, it is possible to decrease the possibility of short-circuiting due to manufacturing defects near the edge and the possibility of defects due to electric field concentration.

As shown in FIG. 13, the capacitor insulating film 75 is formed in a non-opening region disposed in a gap between opening regions of pixels as shown in a plan view of the TFT array substrate 10. Namely, the capacitor insulating film 75 is substantially not formed in the opening regions. Therefore, even if the capacitor insulating film 75 is an opaque film, transmittance of light in the opening regions is not decreased. Therefore, as a material for forming the dielectric film 75a of the capacitor insulating film 75, a metal oxide with high dielectric constant, such as alumina, may be used regardless of transmittance. For the protective film 75b, for example, hafnium oxide ($HfO_2$) may be used.

(Configuration of Fifth Layer—Pixel Electrodes, Etc—)

The third interlayer insulating film 43 is formed over the entire surface of the fourth layer, and further, the pixel electrodes 9a are formed as the fifth layer on the third interlayer insulating film 43. The third interlayer insulating film 43 is composed of, for example, NSG. Silicate glass such as PSG, BSG, BPSG, and the like, silicon nitride, silicon oxide, and the like may be used for the third interlayer insulating film 43. Like the second interlayer insulating film 42, the surface of the third interlayer insulating film 43 is planarized by CMP or the like.

The pixel electrodes 9a (the outlines are shown by broken lines 9a' in FIG. 13) are arranged in pixel regions which are partitioned and arranged in a matrix, and the data lines 6a and the scanning lines 11a are arranged in a lattice form at the boundaries between the pixel regions (refer to FIGS. 12 and 13). The pixel electrodes 9a are composed of a transparent conductive film, such as an ITO (Indium Tin Oxide) film.

Each of the pixel electrodes 9a is electrically connected to the extension of the capacitor electrode 300 through the contact hole 85 passing through the interlayer insulating film 43 (refer to FIG. 15). Therefore, the potential of the capacitor electrode 300 including a conductive film and disposed immediately below each pixel electrode 9a becomes a pixel potential. Therefore, during an operation of the liquid crystal device 1, the pixel potential is not adversely affected by parasitic capacitance between the pixel electrodes 9a and the conductive films in a lower layer.

As described above, the extension of the capacitor electrode 300 and the relay layer 600 and the relay layer 600 and the high-concentration drain region 1e of the TFT 30 are electrically connected to each other through the contact holes 84 and 83, respectively. That is, the pixel electrode 9a and the high-concentration drain region 1e of the TFT 30 are electrically connected to each other through the relay layer 600 and the extension of the capacitor electrode 300. Thus, it is possible to avoid difficulty in connecting a pixel electrode and a drain through a contact hole because of a long distance between layers. In addition, the layered structure and the manufacturing process are not complicated. Further, an alignment film 16 subjected to predetermined orientation treatment, such as rubbing, is provided on the pixel electrodes 9a. The configuration of the pixel portion on the TFT array substrate side is described above.

On the other hand, on the counter substrate 20, the counter electrode 21 is provided over the entire surface of the facing surface, and further, an alignment film 22 is provided on the counter electrode 21 (the lower side of the counter electrode 21 shown in FIG. 15). Like the pixel electrodes 9a, the counter electrode 21 is composed of a transparent conductive film, for example, an ITO film. In order to prevent the occurrence of light leakage in the TFTs 30, a light-shielding film 23 is provided between the counter substrate 20 and the counter electrode 21 so as to cover at least a region facing the TFT 30.

The liquid crystal layer 50 is provided between the TFT array substrate 10 and the counter substrate 20 configured as described above. The liquid crystal layer 50 is formed by sealing a liquid crystal in a space formed by sealing the peripheries of the substrates 10 and 20 with a sealing material. When an electric field is not applied between the pixel electrodes 9a and the counter electrode 21, the liquid crystal layer 50 assumes a predetermined orientation state by the alignment films 16 and 22 subjected to orientation treatment such as rubbing or the like.

The above-described configuration of the pixel portion is common to all pixel portions as shown in FIGS. 12 and 13. The pixel portions are periodically formed in the image display region 10a (refer to FIG. 9). On the other hand, in the liquid crystal device 1, as described above with reference to FIGS. 9 and 10, drive circuits such as the scanning line drive circuit 104, the data line drive circuit 101, and the like are formed in a peripheral region disposed around the image display region 10a.

The entire disclosure of Japanese Patent Application No. 2008-270614, filed Oct. 21, 2008 is expressly incorporated by reference herein.

What is claimed is:

1. A capacitor element substrate comprising:
   a lower conductive portion;
   an underlying film which covers the lower conductive portion;
   a lower electrode formed on the underling film;
   a capacitor insulating film including:
      a dielectric film formed on the lower electrode; and
      a protective film formed on the dielectric film and having a lower etching rate than that of the dielectric film;
   an upper electrode formed on the capacitor insulating film, the upper electrode and the lower conductive portion being electrically connected to each other through a connection portion exposed from the underlying film by partially removing the underlying film and the capacitor insulating film; and
   an interlayer insulating film formed between the capacitor insulating film and the lower electrode outside a region occupied by a layered structure formed by laminating in order the lower electrode, the capacitor insulating film, and the upper electrode.

2. An electro-optic device comprising: the capacitor element substrate according to claim 1 and a pixel electrode, wherein the upper electrode is electrically connected to the pixel electrode.

3. An electro-optic device comprising:
   a capacitor element substrate including:
      a lower conductive portion;
      an underlying film which covers the lower conductive portion;
      a lower electrode formed on the underling film;
      a capacitor insulating film including:
         a dielectric film formed on the lower electrode; and
         a protective film formed on the dielectric film and having a lower etching rate than that of the dielectric film;
      an upper electrode formed on the capacitor insulating film, the upper electrode and the lower conductive portion being electrically connected to each other through a connection portion exposed from the underlying film by partially removing the underlying film and the capacitor insulating film; and
   a pixel electrode, wherein the upper electrode is electrically connected to the pixel electrode.

* * * * *